United States Patent
Elers et al.

(10) Patent No.: US 6,475,276 B1
(45) Date of Patent: *Nov. 5, 2002

(54) PRODUCTION OF ELEMENTAL THIN FILMS USING A BORON-CONTAINING REDUCING AGENT

(75) Inventors: Kai-Erik Elers; Ville Antero Saanila, both of Helsinki; Sari Johanna Kaipio, Järvenpää; Pekka Juha Soininen, Espoo, all of (FI)

(73) Assignee: ASM Microchemistry Oy (FI)

( * ) Notice: Subject to any disclaimer, the term of this patent is extended or adjusted under 35 U.S.C. 154(b) by 0 days.

This patent is subject to a terminal disclaimer.

(21) Appl. No.: 09/687,205

(22) Filed: Oct. 13, 2000

Related U.S. Application Data

(60) Provisional application No. 60/176,948, filed on Jan. 18, 2000, and provisional application No. 60/159,799, filed on Oct. 15, 1999.

(30) Foreign Application Priority Data

| Oct. 15, 1999 | (FI) | 992233 |
| Oct. 15, 1999 | (FI) | 992234 |
| Oct. 15, 1999 | (FI) | 992235 |
| Mar. 10, 2000 | (FI) | 000564 |

(51) Int. Cl.$^7$ .......................................... C23C 16/08
(52) U.S. Cl. .................... 117/84; 117/88; 427/250; 427/253; 427/255.28; 438/680; 438/685; 438/687
(58) Field of Search ............... 117/88, 84; 427/250, 427/253, 255.28; 438/680, 685, 687

(56) References Cited

U.S. PATENT DOCUMENTS

| 4,058,430 A |   | 11/1977 | Suntola et al. ............... 156/611 |
| 5,281,274 A |   | 1/1994 | Yoder ........................... 118/697 |
| 5,306,666 A | * | 4/1994 | Izumi ............................ 427/124 |
| 5,711,811 A | * | 1/1998 | Suntola et al. ............... 118/715 |
| 5,916,365 A |   | 6/1999 | Sherman ....................... 117/92 |
| 6,099,904 A |   | 8/2000 | Mak et al. .................... 427/253 |

FOREIGN PATENT DOCUMENTS

| EP | 1 167 567 A1 | 1/2002 | ........... C23C/16/02 |

OTHER PUBLICATIONS

J.W. Klaus, S.J. Ferro, and S.M. George, "Atomic Layer Deposition of Tungsten Nitride Films Using Sequential Surface Reactions," *Journal of the Electrochemical Society*, vol. 147, No. 3, pp. 1175–1181, (2000).

J.W. Klaus, S.J. Ferro, S.M. George, "Atomic layer deposition of tungsten using sequential surface chemistry with a sacrificial stripping reaction," *Thin Solid Films*, vol. 360, pp. 145–153, (2000).

J.W. Klaus, S.J. Ferro, S.M. George, "Atomically controlled growth of tungsten and tungsten nitride using sequential surface reactions," *Applied Surface Science*, vols. 162–163, pp. 479–491, (2000).

(List continued on next page.)

*Primary Examiner*—Timothy Meeks
(74) *Attorney, Agent, or Firm*—Knobbe, Martens, Olson & Bear, LLP.

(57) ABSTRACT

The present invention relates generally to depositing elemental thin films. In particular, the invention concerns a method of growing elemental metal thin films by Atomic Layer Deposition (ALD) using a boron compound as a reducing agent. In a preferred embodiment the method comprises introducing vapor phase pulses of at least one metal source compound and at least one boron source compound into a reaction space that contains a substrate on which the metal thin film is to be deposited. Preferably the boron compound is capable of reducing the adsorbed portion of the metal source compound into its elemental electrical state.

40 Claims, 1 Drawing Sheet

OTHER PUBLICATIONS

Per Martensson and Jan–Otto Carlsson, "Atomic Layer Epitaxy of Copper and Tantalum," *Chemical Vapor Deposition*, vol. 3, No. 1, pp. 45–50, (1997).

Per Martensson and Jan–Otto Carlsson, CU(THD)$_2$ As Copper Source in Atomic Layer Epitaxy, *Electrochemical Society Proceedings*, vol. 97–25, pp. 1529–1536.

Per Martensson, "Use of atomic layer epitaxy for fabrication of Si/TiN/Cu Structures," *J. Vac. Sci. Technol. B*, vol. 17, No. 5, pp. 2122–2128, (Sep./Oct. 1999).

Marika Juppo, Mikko Ritala and Markku Leskelä, "Deposition of copper films by an alternate supply of CuCl and Zn," *J. Vac. Sci. Technol A*, vol. 15, No. 4, pp. 2330–2333, (Jul./Aug. 1997).

A. Sherman, S. Maihotra, S. M. Rossnagel, "Plasma enhanced atomic layer deposition of Ta for diffusion barrier applications," AVS 46th International Symposium, Paper TF–TuM5 (abstract), (Oct. 26,1999), Seattle, WA.

* cited by examiner

PRODUCTION OF ELEMENTAL THIN FILMS USING A BORON-CONTAINING REDUCING AGENT

REFERENCE TO RELATED APPLICATIONS

The present application claims the priority benefit under 35 U.S.C. §119(e) to U.S. Provisional Application No. 60/176,948, filed Jan. 18, 2000, and No. 60/159,799 filed Oct. 15, 1999 and under 35 U.S.C. §119(a) to Finnish Application Nos. FI 19992233, filed Oct. 15, 1999, FI19992234 filed Oct. 15, 1999, FI19992235, filed Oct. 15, 1999 and FI20000564 filed Mar. 10, 2000.

BACKGROUND OF THE INVENTION

1. Field of the Invention

The present invention relates generally to a method of depositing thin films. In particular, the invention concerns a method of growing elemental metal thin films by Atomic Layer Deposition (ALD) using a boron compound as a reducing agent.

2. Description of the Related Art

The integration level of components in integrated circuits is increasing, producing a need for smaller components and interconnects. Design rules are dictating a feature size less than or equal to 0.2 $\mu$m. This makes complete film coverage on deep vias difficult to obtain.

Integrated circuits contain interconnects that are conventionally made of aluminum. Today, copper is replacing aluminum because it has lower electrical resistance and better electromigration resistance than aluminum.

Chemical Vapor Deposition (CVD) has been commonly used to produce metal films. In CVD, the source materials are typically fed into a reaction space together, where they react when brought into contact with a hot substrate. Thus, the growth rate of the metal film depends in part upon the concentration of the different source materials in the reaction space. Additionally, the temperature of the substrate affects the rate of deposition. In thermal CVD a single source chemical can be thermally decomposed near the substrate.

Atomic Layer Deposition (ALD) is an advanced alternative to CVD. The ALD method is based on sequential self-saturating surface reactions and has been described in detail in U.S. Pat. Nos. 4,058,430 and 5,711,811. Source chemicals are pulsed into the reaction chamber in an inert carrier gas. The pulses of source chemical can be separated from each other by a purging flow of inert gas. The separation of the source chemicals and the proper choice of source chemicals prevents gas-phase reactions between gaseous reactants and enables self-saturating surface reactions. This allows for film growth without strict temperature control of the substrate or precise dosage control of the reactants. Surplus reactants and byproducts are removed from the chamber, such as by a purging flow of inert gas, before the next reactive chemical pulse is introduced. Undesired gaseous molecules are effectively removed from the reaction chamber by keeping the gas flow speeds high. The purging gas pushes the extra molecules towards the vacuum pump that is used to maintain a suitable pressure in the reaction chamber. Thus, ALD provides for rapid, uniform, controlled film growth.

While ALD has been used to produce both elemental and compound thin films, there are a number of drawbacks to the methods that have been used. Thus, a need exists for improvements in the production of metal thin films.

SUMMARY OF THE INVENTION

In one embodiment, the present invention provides a method of growing elemental thin films on a substrate by an atomic layer deposition (ALD) type process. The method comprises introducing vapor phase pulses of at least one elemental source compound and at least one boron source compound into a reaction space that contains a substrate on which the thin film is to be deposited.

The vapor phase pulses are alternately introduced in a cycle. Each cycle comprises introducing an elemental source compound into a reaction space containing a substrate, removing any gaseous compounds from the reaction space, introducing a boron source compound into the reaction space, and removing any gaseous compounds from the reaction space. The elemental source compound preferably reacts with the surface of the substrate producing a surface bound elemental compound. Preferably the boron source compound is capable of reducing the surface bound elemental compound into elemental form.

In the preferred embodiment a metal source compound is used and an elemental metal thin film is grown on the substrate. The metal source compound and boron source compound are fed into the reaction chamber with the aid of an inert carrier gas. An inert gas may also be used to purge the reaction space after each pulse of metal source compound and boron compound.

In one embodiment the boron compound contains at least one carbon atom and the elemental source compound comprises at least one metal selected from the group consisting of Cu, Ag, Au, Pd, Rh and/or Ir. In another embodiment the boron compound contains no carbon atoms and the elemental source compound comprises at least one metal selected from the group consisting of Cu, Ag, Au, Pd, Rh, Ir, Ti, Zr, Hf, V, Nb, Ta, Cr, Mo and/or W.

In accordance with one aspect of the invention, an electron conductor is produced by an ALD type process wherein a boron compound is used to reduce a surface bound elemental compound to its elemental state. In accordance with another aspect of the invention, an interconnect is produced in an integrated circuit by depositing a metal thin film by an ALD type process wherein a boron compound is used to reduce a surface bound metal compound to its elemental state. In yet another embodiment a metal seed layer is grown on a substrate by growing an elemental metal thin film on a substrate by an ALD type process wherein a boron compound is used to reduce a surface bound metal compound to its elemental state.

DETAILED DESCRIPTION OF THE PREFERRED EMBODIMENT

Figure 1:
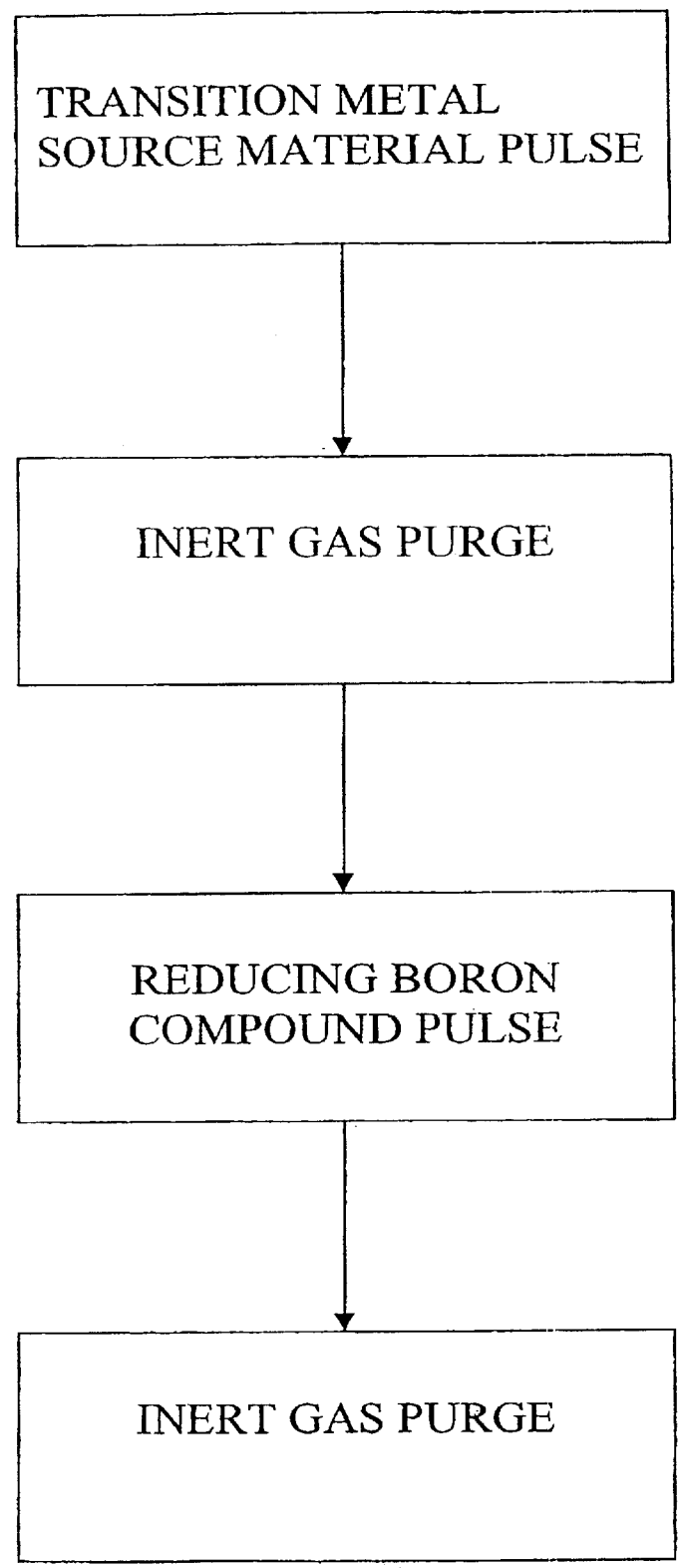
FIG. 1 presents a block diagram of a pulsing sequence for producing elemental films according to a preferred embodiment of the invention.

An "ALD type process" is a process in which deposition of material onto a surface is produced by sequential and alternating self-saturating surface reactions. The principles of ALD are disclosed in U.S. Pat. Nos. 4,058,430 and 5,711,811, the disclosures of which are incorporated herein by reference. "Reaction space" is used to designate the portion(s) a reactor or reaction chamber in which the conditions can be adjusted so that deposition by ALD is possible. "Thin film" is used to designate a film that is grown from elements or compounds that are transported as separate ions, atoms or molecules from the source to the substrate. The thin film may be, for example, an elemental metal thin film. However, one skilled in the art will recognize that the principles and advantages disclosed herein are applicable to elemental thin films other than metal. The inventors have found the processes disclosed herein particularly advantageous for depositing metal layers. The thickness of the film depends on the application and may vary in a wide range. For example, an elemental metal thin film may range from one atomic layer to 1,000 nm in thickness.

"Elemental thin film" means a thin film with constituents having an oxidation state of zero. The elemental thin films disclosed herein comprise elemental metals and metal alloys.

An "elemental source compound" or material is a compound that comprises at least one molecule of the element that is to comprise the desired elemental thin film. In the illustrated embodiments, the elemental source compound is a vapor-phase metal source compound.

A "boron reducing compound" is any boron-containing compound that is capable of reducing an elemental compound to its elemental state.

An "organic boron compound" is a boron-containing compound that comprises at least one carbon atom.

A "surface bound elemental complex" is an adsorbed species upon the substrate that contains the element that is to form the desired thin film, in addition to terminating ligands or tails. The surface bound elemental complex (e.g., chemisorbed metal complex) can be the elemental source compound or a portion thereof.

An "adsorbed metal complex" or "chemisorbed metal complex," as used herein, denote a compound including both a metal atom and terminating ligand(s) such as halide or organic tails.

According to the present invention, a chemical gaseous deposition process is used to produce metal thin films. Preferably, this process is an ALD type process.

According to a preferred embodiment of the present invention, elemental metal thin films are prepared by an ALD type process. Surface bound or chemisorbed metal complexes are reduced by boron compounds into elemental form. Thus, in one embodiment of the invention, a substrate is first placed in a reaction chamber where it is subjected to alternately repeated surface reactions of at least two vapor-phase reactants. Preferably the substrate is maintained at an elevated temperature. The boron reducing compounds preferably are not incorporated appreciably into the resulting thin film.

In the ALD type process of the preferred embodiment, the conditions in the reaction space are adjusted so that gas-phase reactions are avoided. Reactions are limited to adsorption on the substrate in one phase, and reactions that occur between complex adsorbed on the surface of the substrate and a gaseous reactant in another phase. Thus, the molecules of the boron reducing compound react with the surface bound elemental complex on the surface of the substrate.

In the preferred embodiment, vapor-phase pulses of metal source material and the boron reducing agent are alternately and sequentially fed into the reaction space where they contact the surface of the substrate. Initially, the "surface" of the substrate comprises the actual substrate material. Alternately, the substrate may be pretreated in advance. For example, the substrate may be contacted with a chemical that modifies the surface properties of the substrate. During the growing of the metal thin films, the previous thin film layer forms the surface for any subsequent thin film layer.

The metal source material and boron reducing agent are preferably fed into the reaction chamber in pulses with the aid of an inert carrier gas. In one embodiment, each pulse is followed by an inert gas pulse that purges any unreacted residues or byproducts from the reaction chamber. This allows for the use of highly reactive chemicals and thus low deposition temperatures. The inert gas used in the purging pulse is preferably the same gas used as the carrier gas. The inert gas may comprise an inactive gas, such as nitrogen or a noble gas, such as argon.

According to one embodiment, a mild reducing agent is added to the inert gas purge in order to prevent the possible reoxidation of the substrate surface. The reducing agent is preferably used in a concentration of 0.1% to 10%, more preferably 0.5% to 5% and even more preferably 0.5% to 1% by volume of the inert gas. The agent is selected so that it will not have a detrimental effect on the substrate surface. In one embodiment, hydrogen is used as the mild reducing agent.

Thus, one sequence or "cycle" in the process of depositing metal thin films preferably consists of:
1. Feeding a vapor phase pulse of an elemental source chemical into the reaction space with the help of an inert carrier gas;
2. Purging the reaction space with an inert gas;
3. Feeding a vapor-phase pulse of a boron source chemical into the reaction space with the help of an inert carrier gas; and
4. Purging the reaction space with an inert gas.

The above-described cycle can be repeated to produce metal films of the desired thickness.

The deposition can be carried out at atmospheric pressure. Preferably, the deposition is carried out at a reduced pressure of 0.01 mbar to 20 mbar, more preferably 0.1 mbar to 5 mbar. The substrate temperature is preferably low enough to keep the bonds between metal atoms intact and to prevent thermal decomposition of the gaseous reactants. On the other hand, the substrate temperature is preferably high enough to keep the source materials in the gaseous phase. Condensation of the gaseous reactants is preferably avoided. Further, the temperature is preferably sufficiently high to provide the required activation energy for the surface reaction. The preferred temperature depends upon the specific reactants and pressure. However the temperature of the substrate is preferably between 100° C. and 700° C. and more preferably between 250° C. and 500° C.

The source temperature is preferably set below the substrate temperature. If the partial pressure of the source chemical vapor exceeds the condensation limit at the substrate temperature, condensation may occur and the controlled layer-by-layer growth of the film may be lost.

Under the preferred conditions described above, at least a portion of the metal source reactant will bind to the substrate surface through chemisorption. Maximum coverage is obtained when a single layer of surface bound metal complex is formed. At this point there are no more binding sites available for the metal source compound and adsorption ceases. Thus, the amount of reactant bound to the surface of the substrate will be limited by self-saturation and the maximum increase in thin film thickness is one atomic layer per pulsing sequence. Depending on the size of the surface bound or chemisorbed metal complex, the increase in thin film thickness can be less than one atomic layer per pulsing sequence on average. The pulsing sequence is repeated to produce a thin film of the desired thickness.

The amount of time available for the self-saturating reactions is limited mostly by economic factors, such as a required throughput of product. Very thin films may be made by relatively few pulsing cycles. In some cases this will allow for an increase in the source chemical pulse time and thus allow for the use of source compounds with a lower vapor pressure.

The substrate can be any material known in the art. Examples include silicon, silica, coated silicon, copper metal and nitrides, such as metal nitrides. A typical substrate is a silicon wafer coated with nitrides.

The present method provides an excellent way to grow conformal layers in geometrically challenging applications. For example, elemental metal films may be grown on vias or trenches. According to one embodiment of the present invention, a metal thin film is grown on TiN or TaN or another suitable nitride that forms a nucleating layer to which metals can attach. For example, an elemental metal thin film may be grown over a metal nitride diffusion barrier in a dual damascene structure. Thereafter a film of desired form (e.g. copper film) can be grown by an electrolytic method.

The elemental source materials most typically used to grow elemental thin films are preferably volatile or gaseous compounds of the transition metals of groups 3, 4, 5, 6, 7, 8, 9, 10, 11 and/or 12 (according to the IUPAC system) in the periodic table of the elements. In particular, the elemental metal thin films consist essentially of one or more of W, Cu, Ti, Zr, Hf, V, Nb, Ta, Cr, Mo, Pd, Pt, Rh, Ir, Ag and Au.

Since the properties of each elemental compound are different, their suitability for use in the method of the present invention must be individually assessed in light of the other reactants that will be used. The properties of the elemental compounds are known to the skilled artisan and may be found, for example, in N. N. Greenwood and A. Earnshaw, *Chemistry of the Elements*, 1$^{st}$ Edition, Pergamon Press, 1986. Metal compounds that contain Cu, Ag, Au, Pd, Pt, Rh, Ir, Ti, Zr, Hf, V, Nb, Ta, Cr, Mo, and/or W can be alternated in ALD type reactions with boron compounds that do not contain carbon. Metal compounds that contain Cu, Ag, Au, Pd, Pt, Rh and/or Ir are preferably used in ALD type reactions with organic boron compounds.

Preferably the metal source compound will be chosen so that the requirements of sufficient vapor pressure, sufficient thermal stability at the substrate temperature and sufficient reactivity are all met. Sufficient vapor pressure means that there must be enough source compound molecules in the gas phase near the substrate surface to enable self-saturating reactions at the surface. Sufficient thermal stability means that the source compound itself must not undergo thermal decomposition to form unwanted impurities in the thin film or condensation that disturbs thin film growth.

Several other factors that may be considered in selecting the metal (or other elemental) source compound include the availability of the compound in a highly pure form and the ease of handling the material.

In addition, for the formation of elemental metal thin films, the vapor pressure of the elemental metal must be low enough under the conditions in the reactor space that the rate of evaporation of the thin film is lower than the rate of formation from the source compound.

Preferred metal source materials may be found, for example, among metal halides, preferably fluorides, chlorides, bromides or iodides. They may also be found among metal organic compounds, such as alkylaminos, cyclopentadienyls, dithiocarbamates or betadiketonates of the desired metal.

In one embodiment of the present invention, tungsten metal thin films are grown. In this embodiment, one or more of the following compounds are preferably used:

halides, such as $WF_6$, $WCl_6$, $WCl_4$, and $WBr_5$;

carbonyls, such as $W(CO)_6$ and tricarbonyl(mesitylene) tungsten;

cyclopentadienyls, such as bis(cyclopentadienyl)tungsten dihydride, bis(cyclopentadienyl)tungsten dichloride and bis(cyclopentadienyl)ditungsten hexacarbonyl.

A preferred tungsten source material is $WF_6$. A boron compound that does not contain carbon is preferably used as a reducing agent.

According to another embodiment of the present invention, copper metal thin films are grown. For the metal source material, one or more of the following compounds are preferably used:

halides, such as CuCl, CuBr and CuI;

compounds where copper is coordinated to oxygen, such as bis(2,2,6,6-tetramethyl-3,5-heptanedionato)copper, copper(II) 2 ethylhexanoate, bis(2,4-pentanedionato) copper and their derivatives such as bis(1,1,1-trifluoro-2,4-pentanedionato)copper and bis(ethylacetoacetonato)copper;

compounds where copper is coordinated to sulfur, such as copper(I)-butanethiolate and copper dialkyldithiocarbamates.

A preferred copper source material is CuCl. The suggested reaction equations for the deposition of copper from CuCl and TEB are presented below (R1–R3).

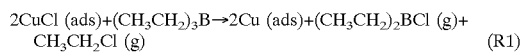

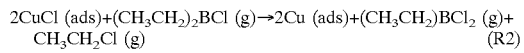

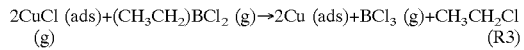

In addition to thin films comprised of a single metal, the present invention contemplates thin films comprising two or more metals. In this way it is possible to achieve a thin film that has the beneficial properties of more than one metal, such as the good conductivity of one metal and the good corrosion resistance of another. For example, thin films that contain both titanium and tungsten provide a barrier layer for preventing the interdiffusion of copper into silicon and dielectrics.

When the elemental source material reacts with the substrate, a covalent bond is formed with the surface bonding groups. The surface bound elemental complex (e.g., chemisorbed metal complex) is surface terminated, such as with halogen or hydrocarbon tails, that are not further reactive with the elemental source material. According to the method of the present invention, the surface bound elemental complex is reduced in a reaction with a gaseous boron compound.

The boron source compound is chosen using the same criteria as for the metal source compound, as described above. In general, the boron source compound may be any volatile, sufficiently thermally stable boron compound that is capable of reducing the surface bound elemental complex. The reducing strengths of boron compounds vary. Thus, for the deposition of metal thin films, it is preferable to use a boron compound that is able to reduce the chemisorbed metal complex to its elemental state. Organic boron compounds are preferably used to reduce metal complexes containing Cu, Ag, Au, Pd, Pt, Rh and/or Ir, while boron compounds that do not contain carbon atoms are preferably used to reduce metal complexes containing Cu, Ag, Au, Pd, Pt, Rh, Ir, Ti, Zr, Hf, V, Nb, Ta, Cr, Mo and/or W.

The reaction of different surface bound elemental complexes with the same reducing agent leads to different reaction products. In the preferred embodiment of the present invention, the elemental source compound and boron compound are selected so that the byproducts resulting from the reaction of the surface bound elemental complex and the boron compound are gaseous. The byproducts are preferably removed from the reaction space with inert gas during the purging pulse. In addition, the byproducts preferably do not decompose catalytically or thermally to condensable species. In this way the incorporation of byproducts, such as boride, into the thin films as impurities is avoided.

Selection of the elemental source compound and the boron compound according to the above criteria allows for the progressive growth of thin films by successive reaction sequences without a decrease in the growth rate caused by contamination of reactive sites on the substrate surface. Preferably the growth rate decreases by a maximum of 0.1% per cycle, more preferably by less than 0.01% and even more preferably by less than 0.001% per cycle.

The selection of elemental source compounds and boron reducing compounds can be facilitated with computer programs having a sufficiently extensive thermodynamics database. This enables one skilled in the art to check the reaction equilibrium and predict which reactants have thermodynamically favorable reactions. An example of this type of program is HSC Chemistry, Version 3.02, available from Outokumpu Research Oy of Pori, Finland.

The availability of a vast number of boron compounds makes it possible to choose one with the desired reducing strength while avoiding undesirable byproducts such as boride. In addition, it is possible to use more than one boron compound in the production of a single thin film.

Preferably, one or more of the following boron compounds is used:

Boranes according to formula I or formula II.

$$B_nH_{n+x},\qquad\text{(I)}$$

Wherein n is an integer from 1 to 10, preferably from 2 to 6, and x is an even integer, preferably 4, 6 or 8.

$$B_nH_m\qquad\text{(II)}$$

Wherein n is an integer from 1 to 10, preferably form 2 to 6, and m is an integer different than n, from 1 to 10, preferably from 2 to 6.

Of the above boranes according to formula I, examples include nido-boranes ($B_nH_{n+4}$), arachno-boranes ($B_nH_{n+6}$) and hyph-boranes ($B_nH_{n+8}$). Of the boranes according to formula II, examples include conjuncto-boranes ($B_nH_m$). Also, borane complexes such as $(CH_3CH_2)_3N$—$BH_3$ can be used.

Borane halides, particularly fluorides, bromides and chlorides.

An example of a suitable compound is $B_2H_5Br$. Further examples comprise boron halides with a high boron/halide ratio, such as $B_2F_4$, $B_2Cl_4$ and $B_2Br_4$. It is also possible to use borane halide complexes.

Halogenoboranes according to formula III.

$$B_nX_n\qquad\text{(III)}$$

Wherein

X is Cl or Br and n is 4 or an integer from 8 to 12 when X is Cl, or n is an integer from 7 to 10 when X is Br.

Carboranes according to formula IV.

$$C_2B_nH_{n+x}\qquad\text{(IV)}$$

Wherein n is an integer from 1 to 10, preferably from 2 to 6, and x is an even integer, preferably 2, 4 or 6.

Examples of carboranes according toformula IV include closo-carboranes ($C_2B_nH_{n+2}$), nido-carboranes ($C_2B_nH_{n+4}$) and arachno-carboranes ($C_2B_nH_{n+6}$).

Amine-borane adducts according to formula V.

$$R_3NBX_3\qquad\text{(V)}$$

Wherein

R is linear or branched C1 to C10, preferably C1 to C4 alkyl or H, and

X is linear or branched C1 to C10, preferably C1 to C4 alkyl, H or halogen.

Aminoboranes where one or more of the substituents on B is an amino group according to formula VI.

$$R_2N\qquad\text{(VI)}$$

Wherein

R is linear or branched C1 to C10, preferably C1 to C4 alkyl or substituted or unsubstituted aryl group.

An example of a suitable aminoborane is $(CH_3)_2NB(CH_3)_2$.

Cyclic borazine (—BH—NH—)$_3$ and its volatile derivatives.

Alkyl borons or alkyl boranes, wherein the alkyl is typically linear or branced C1 to C10 alkyl, preferably C2 to C4 alkyl.

In addition to the boron compounds described above, it is contemplated that silicon compounds may serve a similar function in the present invention.

In one embodiment of the present invention, elemental metal thin films are formed. In this case, the thin film is complete once the boron compound reduces the metal to its elemental state.

EXAMPLES

The following examples illustrate the invention but do not limit the scope of the invention in any way.

Example 1

Copper chloride is pulsed into an ALD reaction chamber until heated substrate surfaces are saturated with adsorbed CuCl molecules. The substrate temperature is low enough to keep source compounds and bonds within adsorbed complex intact, but high enough to prevent condensation of CuCl. The reaction chamber is then purged with inert nitrogen gas until the surplus CuCl has been removed. TEB is then pulsed into the reaction chamber until surface reactions are complete. Examples of possible reaction equations are presented in R2 to R4. Purging the reaction chamber of any surplus TEB and reaction byproducts with inert gas completes the reaction sequence. The reaction sequence is repeated until a metal film of the desired thickness is produced. The substrate temperature is maintained low enough that the copper-copper bond formed in the adsorption of CuCl to the previous thin film layer remains intact.

A 50 mm by 50 mm piece of a silicon wafer and a 50 mm by 50 mm glass substrate were loaded into an ALD reactor. The substrates were heated to 350° C. in a flowing nitrogen atmosphere (500 std. cm$^3$/min) with a pressure of about 10 mbar. Nitrogen gas was used as a carrier for the source chemicals and as a purging gas. The carrier and pulsing gas may include a mild reducing agent such as hydrogen gas to avoid the reoxidation of the copper surface. The pulsing cycle consisted of the following steps:

CuCl vapor pulse for 0.3 seconds.
N$_2$ gas purge for 1.0 seconds.
(CH$_3$CH$_2$)$_3$B vapor pulse for 0.1 seconds.
N$_2$ gas purge for 1.0 seconds.

The pulsing cycle was repeated 1000 times. The resulting thin film had a reddish metallic luster and was electrically conductive.

One skilled in the art will recognize that many variations are possible using the disclosed invention. The present invention is not limited to one particular embodiment, and the embodiments disclosed herein do not limit the scope of the invention in any way.

We claim:

1. A method of growing an elemental thin film on a substrate from vapor phase reactants, comprising alternately introducing vapor phase pulses of at least one elemental source compound and at least one boron source compound into a reaction space containing the substrate, wherein the boron source compound contains at least one carbon atom.

2. The method of claim 1, wherein the method is an atomic layer deposition (ALD) type process.

3. The method of claim 2, wherein the vapor phase pulses are alternately introduced in a cycle comprising:
   introducing an elemental source compound into a reaction space containing a substrate; and
   removing any gaseous compounds from the reaction space; and
   introducing a boron source compound into the reaction space; and
   removing any gaseous compounds from the reaction space.

4. The method of claim 1, wherein the elemental source compound reacts with the surface of the substrate, thereby producing a surface bound elemental complex.

5. The method of claim 4, wherein the boron source compound reduces the surface bound elemental complex into its elemental state.

6. The method of claim 5, wherein gaseous reaction byproducts are formed by the reduction of the surface bound elemental complex into it elemental state.

7. The method of claim 1, wherein the elemental source compound and the boron source compound are fed into the reaction chamber with the aid of an inert carrier gas.

8. The method of claim 1, further comprising feeding an inert gas pulse to the reaction chamber after each pulse of elemental source compound and boron source compound.

9. The method of claim 8, further comprising adding a mild reducing agent to the inert gas pulse.

10. The method of claim 9 wherein the inert gas pulse comprises 0.5% to 1% of the mild reducing agent by volume.

11. The method of claim 9, wherein the mild reducing agent is hydrogen.

12. The method of claim 1, wherein the elemental source compound comprises a metal selected from the group consisting of Cu, Ag, Au, Pd, Pt, Rh and Ir.

13. The method of claim 1, wherein the boron source compound is selected from the group consisting of carboranes according to the formula C$_2$B$_n$H$_{n+x}$, wherein n is an integer from 1 to 10 and x is an even integer.

14. The method of claim 13, wherein the boron source compound is selected from the group consisting of closo-carboranes of the formula C$_2$B$_n$H$_{n+2}$, nido-carboranes of the formula C$_2$B$_n$H$_{n+4}$ and arachno-carboranes of the formula C$_2$B$_n$H$_{n+6}$, wherein n is an integer from 1 to 10.

15. The method of claim 1, wherein the boron source compound is selected from the group consisting of amine-borane adducts according to the formula R$_3$NBX$_3$ wherein R is linear or branched C1 to C10 or H and X is linear or branched C1 to C10, H or a halogen.

16. The method of claim 1, wherein the boron source compound is selected from the group consisting of aminoboranes, wherein one or more of the substituents is an amino group according to the formula R$_2$N, wherein R is linear or branched C1 to C10 or a substituted or unsubstituted aryl group.

17. The method of claim 1, wherein the boron source compound is selected from the group consisting of alkyl borons and alkyl boranes, wherein the alkyl is a linear or branched C1 to C10 alkyl.

18. A method of growing an elemental thin film on a substrate from vapor phase reactants, comprising alternately introducing vapor phase pulses of at least one elemental source compound and at least one boron source compound into a reaction space containing the substrate, wherein the boron source compound contains no carbon atoms and wherein the boron source compound is selected from the group consisting of boron halides, borane halides and complexes thereof.

19. The method of claim 18, wherein the boron source compound is selected from the group consisting of boron halides having a boron/halide ratio between 0.5 and 1.

20. The method of claim 19, wherein the boron source compound is selected from the group consisting of B$_2$F$_4$, B$_2$Cl$_4$ and B$_2$Br$_4$.

21. The method of claim 18, wherein the boron source compound is selected from the group consisting of halogenoboranes of the formula B$_n$X$_n$, wherein X is Cl or Br and n is 4 or an integer from 8 to 12 when X is Cl or n is an integer from 7 to 10 when X is Br.

22. A method of producing an electron conductor in an integrated circuit by an atomic layer deposition (ALD) process, comprising exposing an adsorbed metal complex on a substrate to a boron compound, thereby reducing the metal complex to its elemental metal state, wherein the boron compound contains at least one carbon atom.

23. The method of claim 22, wherein vapor phase pulses are alternately introduced to the substrate in a cycle comprising:
   introducing a vapor-phase metal source compound into a reaction space containing the substrate; and
   removing any gaseous compounds from the reaction space; and
   introducing the boron compound into the reaction space; and
   removing any gaseous compounds from the reaction space.

24. The method of claim 23, wherein at least a portion of the metal source compound chemisorbs upon the substrate, thereby producing the adsorbed metal complex.

25. The method of claim 22, wherein the metal complex comprises a metal selected from the group consisting of Cu, Ag, Au, Pd, Pt, Rh and Ir.

26. A method of producing an interconnect in an integrated circuit, the method comprising:
   introducing a metal source gas into a reaction space holding a substrate;
   removing any unreacted portion of the metal source gas and any gaseous reaction byproduct from the reaction space;

introducing a vapor-phase organic boron source gas into the reaction space; and removing any unreacted portion of the organic boron source gas and any gaseous reaction byproduct from the reaction space.

27. The method of claim 26, wherein introducing the metal source gas comprises saturating the substrate with no more than a monolayer of an adsorbed metal complex.

28. The method of claim 26, wherein the metal source comprises a metal selected from the group consisting of Cu, Ag, Au, Pd, Pt, Rh and Ir.

29. A method of growing a metal layer on a substrate by an atomic layer deposition (ALD) process, comprising adsorbing a metal complex upon the substrate and reducing the metal complex to its elemental state by exposing the substrate to a vapor-phase boron compound, wherein the boron compound contains at least one carbon atom.

30. The method of claim 29, wherein the metal complex comprises at least one metal selected from the group consisting of Cu, Ag, Au, Pd, Pt, Rh and Ir.

31. The method of claim 30, wherein the boron compound is selected from the group consisting of carboranes according to the formula $C_2B_nH_{n+x}$, wherein n is an integer from 1 to 10 and x is an even integer.

32. The method of claim 30, wherein the boron compound is selected from the group consisting of closo-carboranes of the formula $C_2B_nH_{n+2}$, nido-carboranes of the formula $C_2B_nH_{n+4}$ and arachno-carboranes of the formula $C_2B_nH_{n+6}$, wherein n is an integer from 1 to 10.

33. The method of claim 30, wherein the boron compound is selected from the group consisting of amine-borane adducts according to the formula $R_3NBX_3$ wherein R is linear or branched C1 to C10 or H and X is linear or branched C1 to C10, H or a halogen.

34. The method of claim 30, wherein the boron compound is selected from the group consisting of aminoboranes, wherein one or more of the substituents is an amino group according to the formula $R_2N$, wherein R is linear or branched C1 to C10 or a substituted or unsubstituted aryl group.

35. The method of claim 30, wherein the boron compound is selected from the group consisting of alkyl borons and alkyl boranes, wherein the alkyl is a linear or branched C1 to C10 alkyl.

36. The method of claim 29, wherein the metal layer comprises an electrodeposition seed layer in an integrated circuit metallization scheme.

37. A method of growing a metal layer on a substrate by an atomic layer deposition (ALD) process, comprising adsorbing a metal complex upon the substrate and reducing the metal complex to its elemental state by exposing the substrate to a vapor-phase boron compound, wherein the boron compound does not contain a carbon atom and the metal complex comprises at least one metal selected from the group consisting of Cu, Ag, Au, Pd, Pt, Rh, Ir, Ti, Zr, Hf, V, Nb, Ta, Cr, Mo and W, and wherein the boron compound is selected from the group consisting of boron halides, borane halides and complexes thereof.

38. The method of claim 37, wherein the boron compound is selected from the group consisting of boron halides having a boron/halide ratio between 0.5 and 1.

39. The method of claim 38, wherein the boron compound is selected from the group consisting of $B_2F_4$, $B_2Cl_4$ and $B_2Br_4$.

40. The method of claim 37, wherein the boron compound is selected from the group consisting of halogenoboranes of the formula $B_nX_n$, wherein X is Cl or Br and n is 4 or an integer from 8 to 12 when X is Cl or n is an integer from 7 to 10 when X is Br.

* * * * *